United States Patent
Tang

(10) Patent No.: US 7,360,129 B2
(45) Date of Patent: Apr. 15, 2008

(54) SIMULTANEOUS SWITCH TEST MODE

(75) Inventor: Chengfuh J Tang, Saratoga, CA (US)

(73) Assignee: Broadcom Corporation, Irvine, CA (US)

( * ) Notice: Subject to any disclaimer, the term of this patent is extended or adjusted under 35 U.S.C. 154(b) by 551 days.

(21) Appl. No.: 10/747,276

(22) Filed: Dec. 30, 2003

(65) Prior Publication Data

US 2005/0144545 A1    Jun. 30, 2005

(51) Int. Cl.
*G11C 29/00* (2006.01)
*G11C 7/00* (2006.01)
*G01R 31/28* (2006.01)

(52) U.S. Cl. .................... 714/718; 714/724; 365/201

(58) Field of Classification Search ............... 714/724
See application file for complete search history.

(56) References Cited

U.S. PATENT DOCUMENTS

| | | | |
|---|---|---|---|
| 6,505,317 B1* | 1/2003 | Smith et al. ............... | 714/738 |
| 6,766,484 B2* | 7/2004 | Motoyama ................ | 714/718 |
| 6,782,336 B2* | 8/2004 | Shah ......................... | 702/118 |
| 6,788,098 B1* | 9/2004 | Alani et al. ............... | 326/16 |
| 7,036,055 B2* | 4/2006 | Muljono et al. .......... | 714/716 |
| 2004/0123205 A1* | 6/2004 | Lin et al. .................. | 714/738 |

OTHER PUBLICATIONS

"Advanced Electronic Packaging—with Emphasis on Multichip Modules," William D. Brown, ed., IEEE Press, New York, New York, 1999, pp. vii-xxii and 174-175.
"Focused Ion Beam," Accurel—Systems International Corp., downloaded on or about Dec. 16, 2003, from link http://www.accurel.com/html/Brochures/PDF/fib_brochure_2.pdf, 2 pages.

* cited by examiner

*Primary Examiner*—Cynthia Britt
(74) *Attorney, Agent, or Firm*—Sterne Kessler Goldstein & Fox, P.L.L.C.

(57) ABSTRACT

The present invention provides a simultaneous switching (SS) test mode. SS test modules supporting an SS test mode are provided. When SS test mode is enabled, SS test mode data is driven on a data bus during an idle bus period. Otherwise, when SS test mode is disabled, no SS test mode data is driven on a data bus during an idle bus period.

16 Claims, 6 Drawing Sheets

SIMULTANEOUS SWITCH TEST MODE

FIELD OF THE INVENTION

The present invention relates to testing, and in particular to testing an integrated circuit on a chip.

BACKGROUND

Integrated circuits (ICs) on a chip are prevalent in a variety of applications and electronic devices. Increasing demands are made to fabricate ICs with larger numbers of circuit elements at higher densities and smaller line widths. Signal coupling and noise issues are becoming a major concern in areas such as, system-on-chip (SOC), due to high integration. Undesired simultaneous switching (SS) events can arise in a chip package where one or more drivers on a data bus switch states at the same time. In one example model of a 64-bit bus, if many drivers switch from high to low at the same time there can be a large current surge. Any output remaining high and internal logic circuitry may see a large voltage dip. The switching of many outputs from high to low can also cause capacitance on the outputs to discharge to ground causing a voltage rise in any low state outputs. A sufficiently large 'power bounce' or ground bounce' can cause false switching and logic errors. See, William D. Brown, ed., *Advanced Electronic Packaging with Emphasis on Multichip Modules* (IEEE Press: New York, N.Y. 1999), pp. 174-175.

Such simultaneous switching can cause current/resistance (IR) drop and ground bounce. IC performance can be degraded. Among other things, IR drop (or power drop) can cause more power to be drawn from a power supply and adversely affect timing. Ground bounce from false switching of a gate is difficult and time consuming to debug. Unfortunately, simultaneous switching can occur in sub-micron technology (e.g., at about 0.18 micron) and will worsen as IC fabrication proceeds to deep sub-micron technology (e.g, 0.13 micron-0.9 micron or below) where circuit elements are even more sensitive.

Testers face present special challenges trying to isolate points of failure in an IC arising from simultaneous switching. Failure is usually extremely random and hard to replicate during testing. Some stations on an IC fail, while others do not fail. Some stations may take several days to fail. Some applications or streams being processed by an IC may fail, while others being handled by the same chip do not fail. Finally, the failure may even be inconsistent.

Conventional testing approaches to SS are limited. Often a time consuming process of varying voltage, temperature, and running a chip overnight with testing by different devices are required. Internal signals may not be directly observable and require expensive focused ion beam (FIB) approaches to debug. State of the art electronic design application (EDA) tools are not capable of detecting dynamic IR drop or noise coupling resulting from SS. Due to the random failure nature of SS, a user usually reports a problem to a manufacturer at a very late stage. For example, this may be reported after a chip is installed in a set-top box or video graphics card. This makes it even harder for a manufacturer to test since it is hard to develop test software or modify programs on the user's platform. For instance, a legal process may have to be followed to gain access to a user's source code, environmental issues need to be resolved to compile and build software, and it is difficult to port a user's a test program to a manufacturer's reference board. As result, a SS failure is often a high priority that requires urgent coordinated effort by engineers of both users and manufacturers to handle. This is costly and disruptive.

What is needed is a testing approach that allows testing for simultaneous switching within hardware to be carried out in a manner which is faster, simpler, and more effective than conventional techniques. A testing approach that allows testing for simultaneous switching within hardware to be carried out selectively on demand even prior to release of a chip is needed.

SUMMARY OF THE INVENTION

The present invention provides a simultaneous switching (SS) test mode. When SS test mode is enabled, SS test mode data is driven on a data bus during an idle bus period. Otherwise, when SS test mode is disabled, no SS test mode data is driven on a data bus during an idle bus period. The bus remains idle and carries static, idle, or other irrelevant data. During an active bus period, normal bus data is transferred regardless of whether SS test mode is enabled or disabled. An SS test mode according to the present invention can be used with any data bus including, but not limited to, a memory data bus, central processor unit (CPU) data bus, or address bus. SS test modules supporting an SS test mode are provided at one or both ends of the data bus.

In an embodiment, SS test modules supporting an SS test mode are provided in a memory controller and/or memory clients. The memory controller and memory clients are coupled by one or more internal data busses having active and idle bus periods. When SS test mode is enabled, SS test mode data is driven on a data bus during an idle bus period. Otherwise, when SS test mode is disabled, no SS test mode data is driven on a data bus during an idle bus period. The bus remains idle and carries static, idle, or other irrelevant data. During an active bus period, normal memory operation data is transferred regardless of whether SS test mode is enabled or disabled. In this way, SS test mode functionality of the present invention allows SS testing to be carried out on-chip while the chip is active and does not interfere with normal memory operations such as the read and write data operations processed by memory clients.

In one embodiment, an internal read data bus is used. A SS test module in a memory controller drives the SS test mode data on the read data bus during an idle bus period on the read data bus. In another embodiment, an internal write data bus is used. A SS test module in a memory client drives the SS test mode data on the write data bus during an idle bus period on the write data bus.

In another embodiment, internal read and write data buses are used. A SS test module in a memory controller drives the SS test mode data on the read data bus during an idle bus period on the read data bus. A SS test module in each memory client (or a logical grouping of memory clients) drives the SS test mode data on the write data bus during an idle bus period on the write data bus.

In embodiments, SS test mode functionality is preferably implemented in hardware at a memory controller and/or memory clients. The present invention is not limited to hardware only, and in alternative embodiments SS test mode functionality is implemented in hardware, firmware, software or any combination thereof.

Further embodiments, features, and advantages of the present inventions, as well as the structure and operation of the various embodiments of the present invention, are described in detail below with reference to the accompanying drawings.

BRIEF DESCRIPTION OF DRAWINGS

The accompanying drawings, which are incorporated herein and form a part of the specification, illustrate the present invention and, together with the description, further serve to explain the principles of the invention and to enable a person skilled in the pertinent art to make and use the invention.

FIG. 2A shows a process for memory read bus operation. FIG. 2B shows a process for memory write bus operation.

Figure 1:
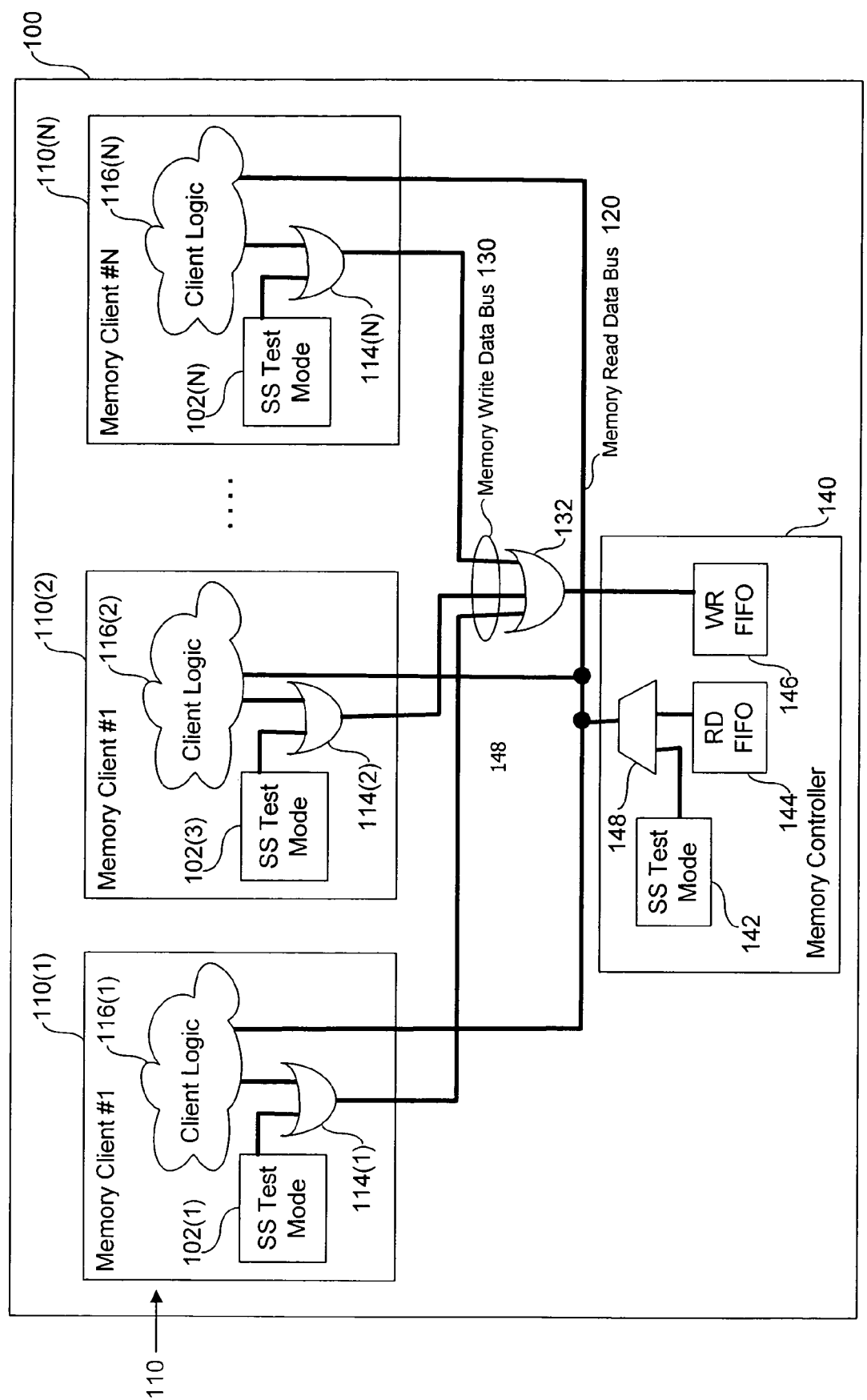
FIG. 1 is a block diagram of a system for providing simultaneous switching (SS) testing of a chip through a memory controller and memory clients according to an embodiment of the present invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF EMBODIMENTS

The present invention provides a system and method for enabling simultaneous switching (SS) testing within a chip. In particular, a SS test mode is provided. When SS test mode is enabled, SS test mode data can be driven on a data bus without interfering with normal bus operation. An SS test mode according to the present invention can be used with any data bus including, but not limited to, a memory data bus, central processor unit (CPU) data bus, or address bus. SS test modules supporting an SS test mode are provided at one or both ends of the data bus.

FIG. 1 is a block diagram of a system 100 for providing simultaneous switching (SS) testing of a chip through a memory controller 140 and memory clients 110 according to an embodiment of the present invention. A number N of memory clients 110(1)-110(N) perform memory operations, such as read and write data operations, to support respective client logic processes 116(1)-116(N). Examples of client logic processes 116(1)-116(N) (also called clients) include tasks being carried out by a central or host processor to run an application, a process of a graphics operation, an operating system task, audio or video capture and playback function, peripheral access function, or any other task of a functional unit performing a memory operation. These examples are illustrative and not intended to limit the present invention.

Each memory client 110 is coupled to one end of a memory read data bus 120 and/or a memory write data bus 130. Memory controller 140 is coupled at an opposite end of memory read data bus 120 and/or memory write data bus 130. Memory controller 140 includes read FIFO 144 and write FIFO 146. Memory controller 140 accesses an external memory (not shown) to service memory operations over buses 120, 130. Read FIFO 144 buffers read data accessed by memory controller 140 prior to delivery over read bus 120. Memory controller 140 sends the buffered read data over read bus 120 during active bus periods. Write FIFO 146 buffers write data sent by memory clients 110 over write bus 130 to memory controller 140 during active bus periods. Memory controller 140 then directs the writing of the buffered write data onto the external memory (not shown) to fulfill the write memory operations carried over write bus 130. A logical OR gate 132 may be provided between write bus 130 and memory controller 140 to combine the write memory data operations of multiple memory clients 110(1)-(N) to a common write FIFO 146. System 100 can include other components of a chip package including, but not limited to, a processor, driver(s), printed circuit board, power supply, etc. depending upon a particular package design or application as would be apparent to a person skilled in the art given this description.

According to the present invention, system 100 enables simultaneous switching (SS) testing within a chip. Each memory client 110(1)-(N) further includes a corresponding SS test module 102(1)-102(N). In one embodiment, outputs from SS test modules 102(1)-(N) and client logic 116(1)-(N) are provided to respective inputs of logical OR gates 114(1)-(N). The outputs of logical OR gates 114(1)-(N) are coupled to memory write data bus 130. Memory controller 140 also includes a SS test module 142. A switch 148 may be coupled between SS test module 142 and read FIFO 144, and memory read data bus 120. Switch 148 switches to direct an output from SS test module 142 or an output from read FIFO 144 to memory read data bus 120.

SS test modules 102, 142 are each enabled during SS testing. They can be enabled (and disabled) automatically by system 100 or manually by a tester or system administrator through a port to system 100. In an example, a register bit in each SS test module 102, 142 is set to indicate whether SS test mode is disabled or enabled. SS test mode can operate on read bus 120 and write bus 130 at the same time. The operation of system 100 including its SS test modules 102, 142 is described further below with respect to FIGS. 2A, 2B, 3 and 4.

Figure 2A:
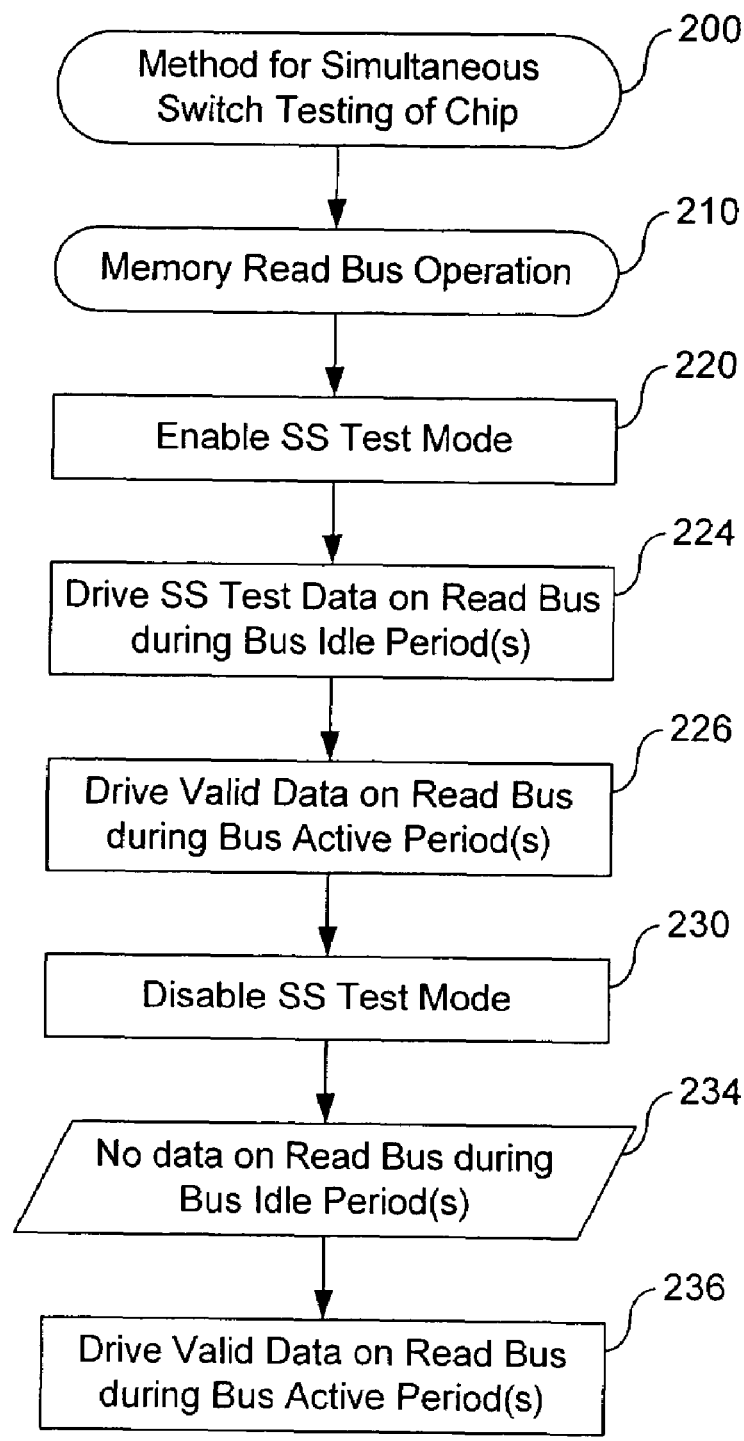
FIGS. 2A and 2B are flowchart diagrams of a method for SS testing of a chip according to an embodiment of the present invention.
Figure 2B:
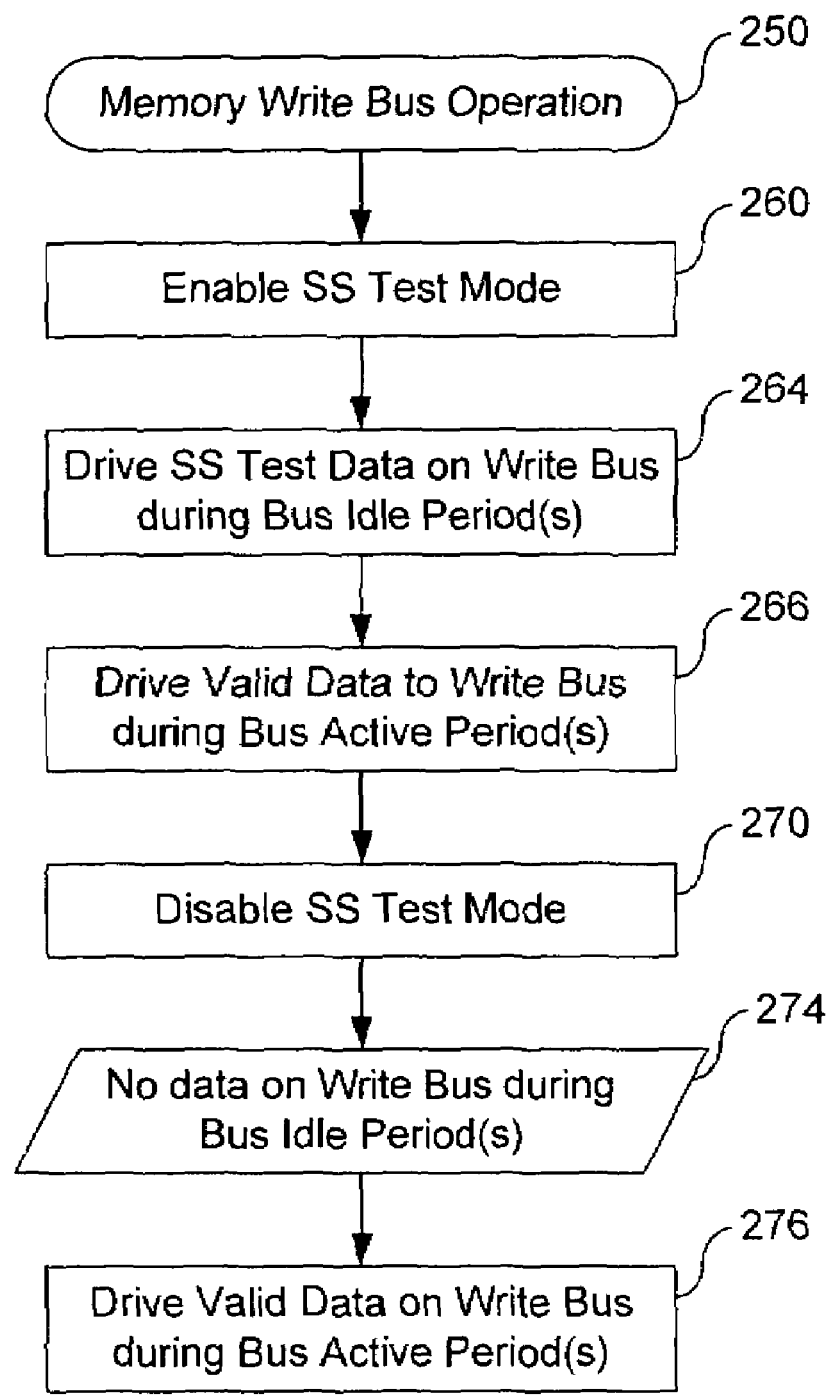

FIGS. 2A and 2B are flowchart diagrams of a method for SS testing of a chip 200 according to an embodiment of the present invention. For brevity, method 200 is described with respect to system 100, however, the present invention and method 200 is not intended to be limited to the specific structure of system 100.

FIG. 2A shows a process for memory read bus operation (steps 210-236). In an embodiment, steps 210-236 are primarily carried out by memory controller 140 and in particular, SS test module 142. In step 220, SS test mode is enabled. For example, SS test module 142 is manually or automatically enabled for simultaneous switching testing. A register bit (or flag) in SS test module 142 is manually or automatically set to indicate SS test mode is enabled.

In step 224, SS test module 142 drives SS test data on memory read data bus 120 during idle bus read periods. SS test module 142 (or memory controller 140) can control switch 148 to receive the output of SS test module 142 and drive SS test data on memory read data bus 120 during idle bus read period(s). The SS test data can be generated by SS test module 142 (or by an external program and forwarded to the SS test module 142). Any type of SS test data can be used. In one example, a pattern of alternating groups of high and low values ("1"s and "0"s) is used.

In step 226, memory controller 140 drives valid data on memory read data bus 120 during active period(s). SS test module 142 (or memory controller 140) can control switch 148 to receive the output of read FIFO 144 and drive valid data from read FIFO 144 onto memory read data bus 120 during active periods. This valid read data is sent to fulfill read requests made by memory clients 110(1)-(N) to support client logic 116(1)-(N). Such client logic can include tasks and processes running on a chip package associated with system 100. For example, tasks of a central or host processor, graphics processor, or software application often make read requests of memory.

In step 230, SS test mode is disabled. In embodiments, SS test module 142 is automatically disabled by system 100 or manually by a tester or system administrator through a port to system 100. A register bit (or flag) in SS test module 142 is manually or automatically set to indicate SS test mode is disabled. In this case, during idle periods, no SS test data is sent over memory read data bus 120 (step 234). Only static, idle, or other irrelevant information is sent on memory read data bus 120 during the idle bus periods. In step 236, memory controller 140 drives valid data on memory read data bus 120 during active period(s) as in step 226 described above. In this way, when SS test mode is disabled, memory read bus 120 operates similar to conventional techniques in that valid data for memory read operations is sent during active bus periods, while idle or static data is present during idle bus periods.

Thus, the present invention leverages idle periods of a memory read bus and allows SS testing to be carried out in a chip package without disrupting normal memory operations.

Figure 3:
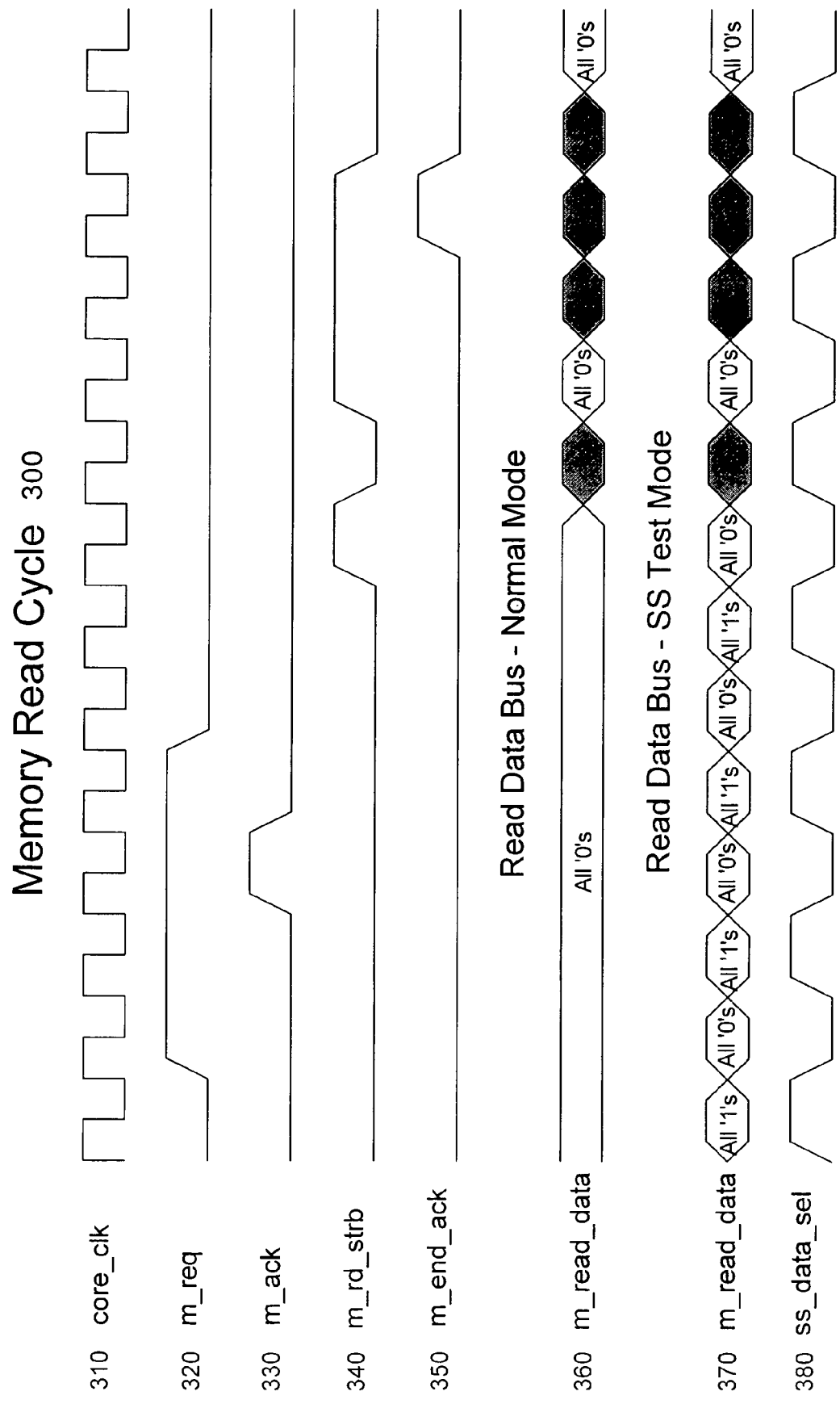
FIG. 3 is a timing diagram that illustrates a memory read cycle according to an embodiment of the present invention.

Memory read bus operation with an SS test mode is further illustrated in FIG. 3. FIG. 3 shows a timing diagram that illustrates waveforms (or signals) in a memory read cycle 300 according to an embodiment of the present invention. A core periodic clock signal 310 is generated within system 100. Signals 320-350 relate to a protocol carried out between each memory client 110 and memory controller 140. This protocol is part of arbitration for efficient access to bus 120 by competing memory clients 110. A memory client (e.g., client 110(1)) sends a memory request (320), and receives an acknowledgment (330) from memory controller 140 indicating that memory client 110(1) now is the "owner" of memory read bus 120. A memory read strobe signal 340 is later sent by memory controller 140 to more precisely inform memory client 110(1) that valid read data will be present on the next succeeding clock cycle. Memory client 110(1) then sends a memory acknowledgment signal (350) to memory controller 140 indicating that valid read data is being received.

Signals 360-380 illustrate by comparison the operation of read data bus 120 with SS test mode disabled (normal mode) and with SS test enabled. The transmission of valid data is represented by grey-scale shading within memory read data signals 360-370. As shown in signal 360, idle data (such as all 0s) is sent during bus idle periods (e.g., arbitration time or no memory activity) as described above with respect to step 234. Valid data is sent during the active bus period as described above with respect to step 236. In this example, valid data from read FIFO 144 is sent on the next clock cycle in response to memory read strobe 340 as can be seen by inspecting waveforms 340, 360.

In contrast, when SS test mode is enabled, memory read data signal 370 shows that SS test mode data is sent during bus idle periods as described above with respect to step 224. Valid data is sent during the active read bus period as described above with respect to step 226. In this example, valid data from read FIFO 144 is sent on the next clock cycle in response to memory read strobe 340 as can be seen by inspecting waveforms 340, 370. Further, when SS test mode data is sent, its value (1 or 0, high or low) is determined by a SS test data value selector signal 380. In one embodiment, signal 380 is sent to all SS test modules 102, 142 to synchronize operation. Signal 380 can be generated internally by one SS test module (designated a master for this purpose) or externally by another functional unit, testing application, etc. SS test data value selector signal 380 can be adjusted to switch on every clock cycle (as shown in FIG. 3), every other clock cycle, or other frequency pattern to help a tester debug or analyze IR drop or ground bounce effects.

FIG. 2B shows a process for memory write bus operation (steps 250-276). In an embodiment, steps 260-276 are primarily carried out by each SS test module 102 in each memory client 110. For brevity, the operation of a single test module 102(1) in memory client 110(1) is described in detail herein. The remaining SS test modules 102(2)-(N) and memory client 110(2)-(N) operate in a similar manner. Depending upon the speed and capacity of bus 130, arbitration may need to be carried out to allocate which SS test module 102(1)-(N) at a given time is considered an owner of bus 130 and can proceed. Such arbitration amongst memory clients 110(1)-(N), if needed, can be carried out by any functional unit internal or external to system 100; or avoided all together by restricting how many memory clients 110(1)-(N) can operate at a given time when SS test mode is enabled. Buffering can also be provided to support additional clients 110 operating at about the same time.

In step 260, SS test mode is enabled. For example, SS test module 102(1) is manually or automatically enabled for simultaneous switching testing. A register bit (or flag) in SS test module 102(1) is manually or automatically set to indicate SS test mode is enabled.

In step 264, enabled SS test module 102(1) drives SS test data on memory write data bus 130 during idle bus write periods. SS test module 102(1) drives SS test data on memory write data bus 130 during idle bus write period(s). The SS test data can be generated by SS test module 102(1) (or by an external program and forwarded to the SS test module 102(1)). Any type of SS test data can be used. In one example, a pattern of alternating groups of high and low values ("1"s and "0"s) is used.

In step 266, memory client 110(1) drives valid data on memory write data bus 130 during active period(s). This valid write data is sent to write FIFO 146 fulfill write requests made by memory client 110(1) to support client logic 116(1). Such client logic can include tasks and processes running on a chip package associated with system 100. For example, tasks of a central or host processor, graphics processor, or software application often make write requests of memory.

In step 230, SS test mode is disabled. In embodiments, SS test module 102(1) is automatically disabled by system 100 or manually by a tester or system administrator through a port to system 100. A register bit (or flag) in SS test module 102(1) is manually or automatically set to indicate SS test mode is disabled. In this case, during idle periods, no SS test data is sent over memory write data bus 130 (step 274). Only static, idle, or other irrelevant information is sent on memory write data bus 130 during the idle bus periods. In step 276, SS test module 102(1) drives valid data on memory write data bus 130 during active period(s) as in step 266 described above. In this way, when SS test mode is disabled, memory write bus 130 operates similar to conventional techniques in that valid data for memory write operations is sent during active bus periods, while idle or static data is present during idle bus periods.

Thus, the present invention leverages idle periods of a memory write bus and allows SS testing to be carried out in a chip package without disrupting normal memory operations.

Figure 4:
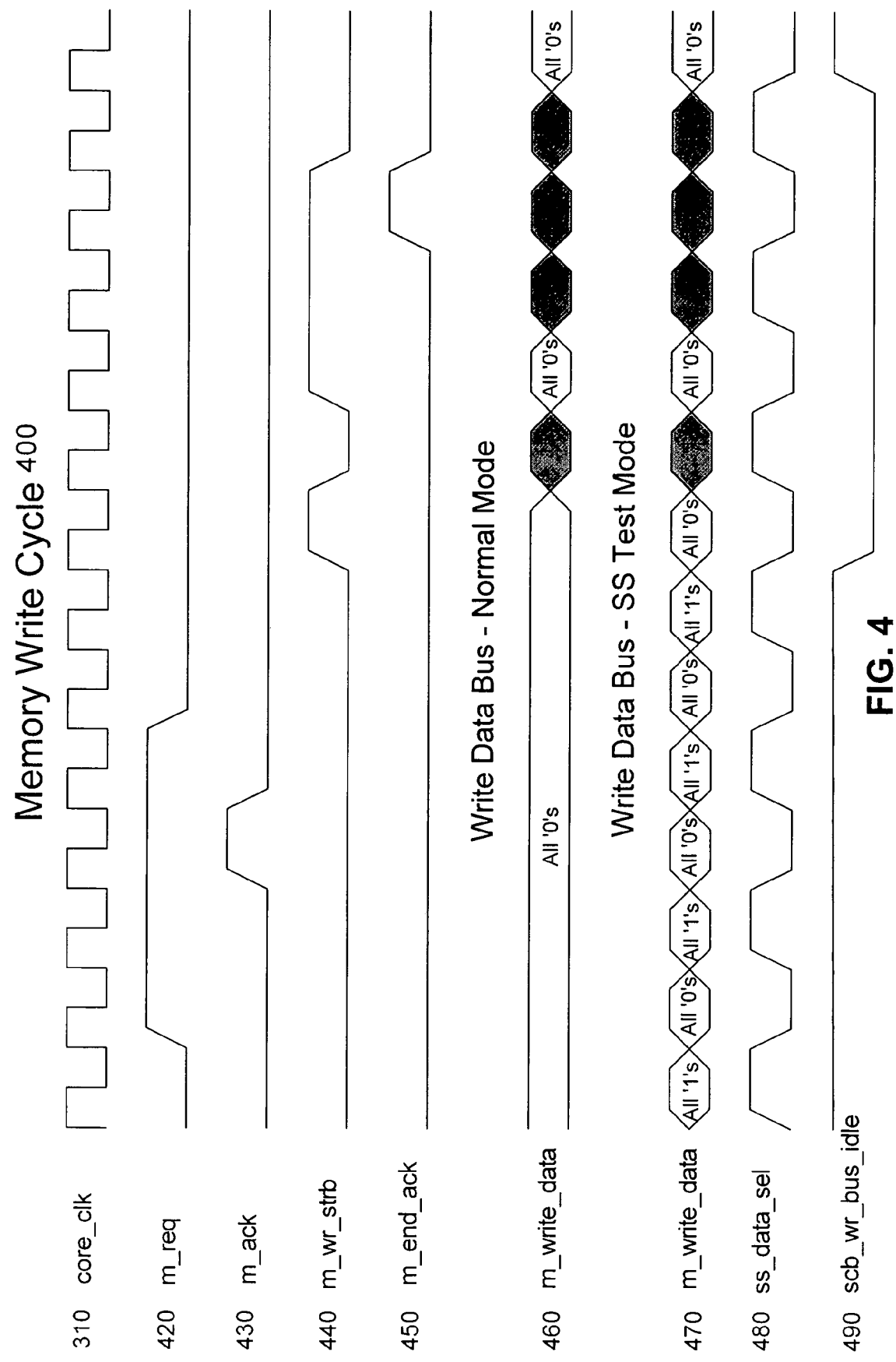
FIG. 4 is a timing diagram that illustrates a memory write cycle according to an embodiment of the present invention.

Memory write bus operation with an SS test mode is further illustrated in FIG. 4. FIG. 4 shows a timing diagram that illustrates waveforms (or signals) in a memory write cycle 400 according to an embodiment of the present invention. Signals 420-450 relate to a protocol carried out between each memory client 110 and memory controller 140. This protocol is part of arbitration for efficient access to bus 130 by competing memory clients 110. A memory client (e.g., client 110(1)) sends a memory request (420), and receives an acknowledgment (430) from memory controller 140 indicating that memory client 110(1) now is the "owner" of memory write bus 130. A memory write strobe signal 440 is later sent by memory client 110(1) to more precisely inform memory controller 140 that valid write data will be present on the next succeeding clock cycle. Memory controller 140 then sends a memory acknowledgment signal (450) to memory client 110(1) indicating that valid write data is being received.

Signals 460-490 illustrate by comparison the operation of write data bus 130 with SS test mode disabled (normal mode) and with SS test enabled. The transmission of valid data is represented by grey-scale shading within memory write data signals 460-470. As shown in signal 460, idle data (such as all 0s) is sent during bus idle periods (e.g., arbitration time or no memory activity) as described above with respect to step 274. Valid data is sent during the active bus period as described above with respect to step 276. In this example, valid write data to write FIFO 146 is sent on the next clock cycle in response to memory write strobe 440 as can be seen by inspecting waveforms 440, 460.

In contrast, when SS test mode is enabled, memory write data signal 470 shows that SS test mode data is sent during bus idle periods as described above with respect to step 264. Valid data is sent during the active write bus period as described above with respect to step 266. In this example, valid data to write FIFO 146 is sent on the next clock cycle in response to memory write strobe 440 as can be seen by inspecting waveforms 440, 470. Further, when SS test mode data is sent, its value (1 or 0, high or low) is determined by a SS test data value selector signal 480. In one embodiment, signal 480 is sent to all SS test modules 102 to synchronize operation. Signal 480 can be generated internally by one SS test module (designated a master for this purpose) or externally by another functional unit, testing application, etc.

A memory write bus idle signal 490 is further generated by memory controller 140 to identify active and idle write bus periods.

Figure 5:
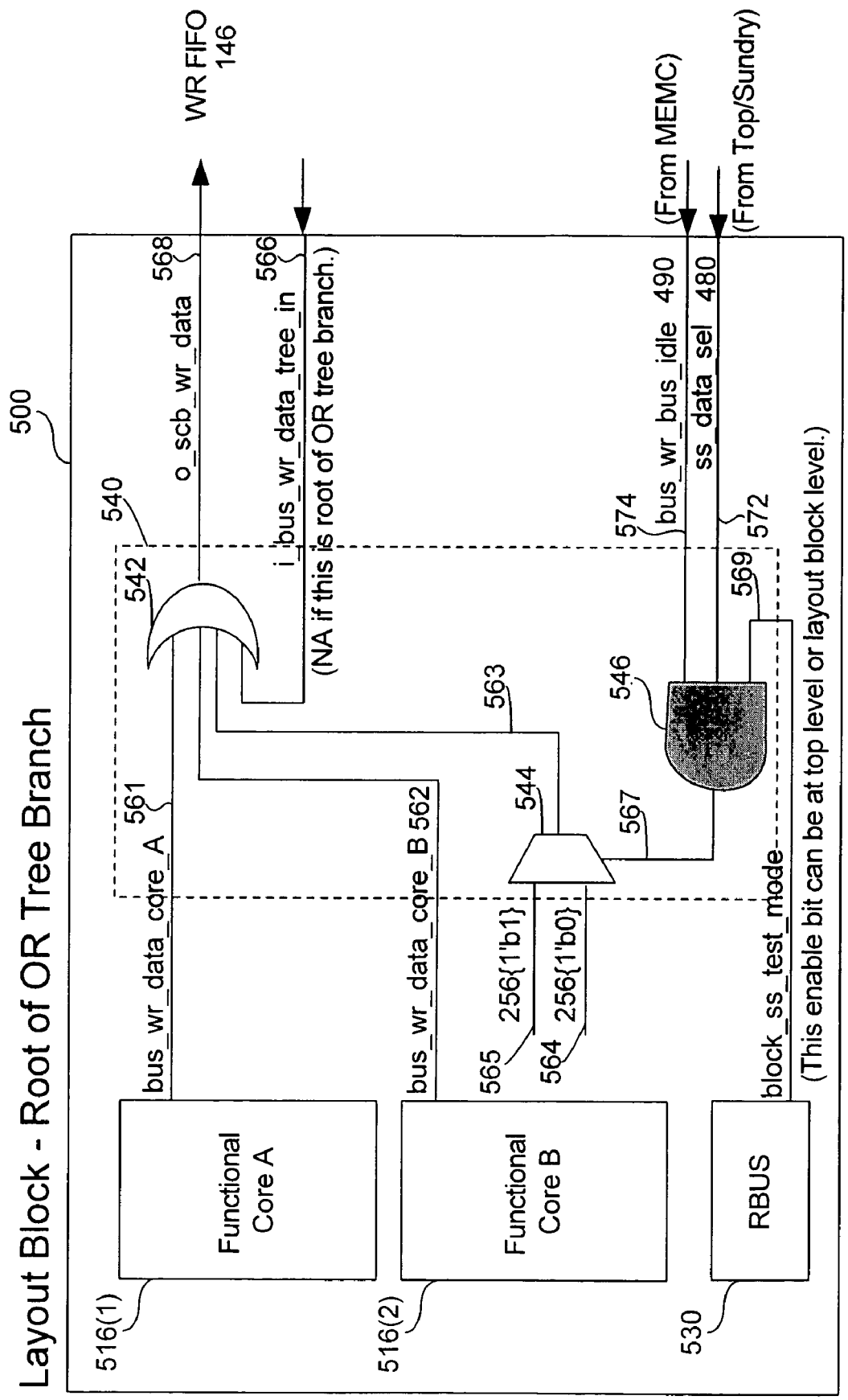
FIG. 5 is a block diagram of a layout block in an OR tree branch configuration according to an embodiment of the present invention.

FIG. 5 is a block diagram of a layout block 500 in an OR tree branch configuration for connecting memory clients to a memory controller over a write bus according to an embodiment of the present invention. Layout block 500, for example, could be a part of the system 100 as described above, Layout block 500 includes memory clients having client logic 516(1), 516(2) (such as functional cores A, B). A register bus (RBUS) 530 stores a register bit value identifying whether SS test mode is enabled or disabled. According to a further feature, the SS test data pattern set by RBUS 530 can be programmable which can help a tester debug or isolate a problem. Outputs from client logic 516(1), 516(2) and RBUS 530 are coupled to logic circuitry 540. Logic circuitry 540 includes an OR gate 542, switch 544, and AND gate 546. Logic circuitry 540 is coupled to memory controller 140 and write FIFO 146.

Block 500 operates to perform write memory operations with an SS test mode as described above. During an active write bus period, client logic 516(1) outputs memory write data over a path 561 to OR gate 542. Likewise, during an active write bus period, client logic 516(2) outputs memory write data over a path 562 to OR gate 542. One advantage of block 500 is two memory clients 516(1), 516(2) are logically grouped and still have an SS test mode. Of course, more clients could be grouped by expanding inputs to OR gate 542. Unless block 500 is a root of an OR tree branch, a signal is input along path 566 to OR gate 542 to facilitate coordination of multiple layout blocks writing to a common write data bus.

Switch 544 (e.g. 2:1 multiplexer) has an output path 563 coupled to OR gate 542 as well. Switch 544 outputs a bus low or high value (e.g., 256 bits) corresponding to its low and high bus inputs 564, 565. Switch 544 is controlled by an output on path 567 from AND gate 546. AND gate 546 receives as inputs: an output on path 569 from RBUS 530, ss test data select signal 480 on path 572 from a top level tester program or other functional unit, and memory write bus signal 490 on path 574 from memory controller 140. In this way, the output of AND gate 546 drives switch 544 to logically control data from client logic 516(1), 516(2) onto a path 568 to write bus 130, and then to write FIFO 146.

FIG. 5 shows multiple clients 516(1), 516(2) coupled in an OR'd configuration. Alternatively, tri-state buffer(s) could be used instead to facilitate the driving of multiple clients onto a common data bus as would be apparent to a person skilled in the art given this description.

The present invention then leverages idle periods of a memory read and/or write data bus and allows SS testing to be carried out in a chip package without disrupting normal memory operations.

The present invention can be used with any type of data bus. In one example not intended to limit the present invention, a 2-way 256-bit (512 bit total) memory data bus is used that runs at 108 MHz with a burst transfer capability switching on every clock cycle.

Further advantages are embodiments of the present invention can be implemented to enable SS test mode on a bus with relatively low additional risk, cost, and effort to bus design. Embodiments of the invention can cover a variety of platforms and software applications including those with different video bit streams and other input conditions.

The present invention can be implemented in software, firmware, hardware or any combination thereof. In examples, the present invention can be implemented in control logic in an processing device, including but not limited to, a general purpose computer, specific purpose computer, server, workstation, personal computer (desktop, laptop, or palm top), personal digital assistant (PDA), network appliance, telephone unit, game console, or a set-top box.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The invention claimed is:

1. A system for enabling simultaneous switch testing within a chip, comprising:
   a plurality of memory clients;
   a memory controller; and at least one bus having active and idle bus periods, coupled between said memory controller and each memory client;
wherein said memory controller includes an SS test module that drives SS test mode data on said at least one bus upon detection of an idle bus period;
wherein each memory client includes an SS test module that drives SS test mode data on said at least one bus upon detection of an idle bus period, and
wherein said memory controller arbitrates among said plurality of SS test modules in said plurality of memory clients for access to said at least one bus.

2. The system of claim 1, wherein said at least one bus carries at least one of read and write data during active bus periods corresponding to read and write operations.

3. The system of claim 1, wherein said at least one bus includes a read data bus and a write data bus.

4. The system of claim 1, wherein each memory client handles data requests made by one or more clients, and said memory controller controls read/write access to memory to fulfill the data requests.

5. The system of claim 1, wherein the one or more clients include functional units executing tasks of at least one of a central processor, graphics processor, digital signal processor, and application program.

6. The system of claim 1, wherein said at least one bus includes a read data bus and said SS test module in said memory controller drives the SS test mode data on said read data bus upon detection of an idle bus period on the read data bus.

7. The system of claim 6, wherein said memory controller outputs a read strobe signal on the read data bus to a selected memory client having a first state indicative of an idle bus period and a second state indicating when valid read data will be sent in an active bus period, and wherein said SS test module in said memory controller drives the SS test mode data on said read data bus upon detection of the idle bus period on the read data bus in response to said read strobe signal.

8. The system of claim 1, wherein said SS test module in said memory controller generates said SS test mode data having first and second data values set based on a SS data select signal.

9. The system of claim 1, wherein said at least one bus includes a write data bus and said SS test module in said at least one memory client drives the SS test mode data on said write data bus upon detection of an idle bus period on the write data bus.

10. The system of claim 9, wherein said SS test mode data of said SS test module in said at least one memory client has first and second data values set based on a SS data select signal.

11. The system of claim 1, wherein said at least one memory client comprises a plurality of memory clients coupled to control logic in an OR tree branch configuration, and said at least one bus includes a write bus.

12. The system of claim 11, said control logic includes an OR gate, switch, and AND gate, wherein said AND gate receives a SS test mode enable/disable signal from a register bus, a SS data select signal and a write bus idle signal, and performs a logical AND function to generate an output signal that is provided to control said switch such that said switch outputs a high or low value to an input of said OR gate; said OR gate also receiving inputs from the memory clients and outputting an output signal to the memory controller when SS test mode is enabled that includes SS test mode data upon detection of idle write bus periods and write data during active write bus periods.

13. A system for enabling simultaneous switch testing within a chip, comprising:
a plurality of memory clients that handle data requests made by one or more clients, wherein each memory client includes an SS test module that drives SS test mode data on said at least one bus upon detection of an idle bus period;
a memory controller that controls access to memory to fulfill data requests; and
a read data bus having active and idle bus periods, coupled between said memory controller and each memory client;
wherein said memory controller includes an SS test module that drives SS test mode data on said read data bus upon detection of an idle bus period, and
wherein said memory controller arbitrates among said plurality of SS test modules in said plurality of memory clients for access to said at least one bus.

14. A system for enabling simultaneous switch testing within a chip, comprising:
a plurality of memory clients that handle data requests made by one or more clients, wherein each memory client includes an SS test module that drives SS test mode data on said at least one bus upon detection of an idle bus period;
a memory controller that controls access to memory to fulfill data requests; and
a write data bus having active and idle bus periods, coupled between said memory controller and each memory client;
wherein at least one memory client includes an SS test module that drives SS test mode data on said write data bus upon detection of an idle bus period, and
wherein said memory controller arbitrates among said plurality of SS test modules in said plurality of memory clients for access to said at least one bus.

15. A method for enabling simultaneous switch testing within a chip that includes at least one bus coupled between a memory controller and memory clients, comprising:
driving SS test mode data on said at least one bus upon detection of an idle bus period, wherein said driving SS test mode data includes:
providing a common SS data select signal at the memory controller and memory clients to set the values of said SS test mode data, whereby said SS test mode data can be synchronized across the memory controller and memory clients; and
driving memory operation data on said at least one bus during an active bus period.

16. The method of claim 15, wherein said at least one bus includes at least one of a read data bus and a write data bus.

* * * * *